US009111714B2

(12) United States Patent
Hong et al.

(10) Patent No.: US 9,111,714 B2
(45) Date of Patent: Aug. 18, 2015

(54) BACKWARD-WAVE OSCILLATOR IN COMMUNICATION SYSTEM

(71) Applicant: ELECTRONICS AND TELECOMMUNICATIONS RESEARCH INSTITUTE, Daejon (KR)

(72) Inventors: Ju Yeon Hong, Daejeon (KR); Young Jun Chong, Daejeon (KR); Jeong Hae Lee, Seoul (KR); Dong Jin Kim, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/475,802

(22) Filed: Sep. 3, 2014

(65) Prior Publication Data

US 2015/0061784 A1 Mar. 5, 2015

(51) Int. Cl.
*H03B 9/08* (2006.01)
*H01J 25/46* (2006.01)
*H01J 23/24* (2006.01)

(52) U.S. Cl.
CPC *H01J 25/46* (2013.01); *H01J 23/24* (2013.01)

(58) Field of Classification Search
CPC .......................................................... H01J 23/24
USPC .................. 331/82, 86, 79; 315/39.55, 3.5, 5; 455/328, 330; 333/156, 161
See application file for complete search history.

(56) References Cited

U.S. PATENT DOCUMENTS 6,060,832 A * 5/2000 Adler et al. .................. 315/5.38
2009/0096378 A1* 4/2009 Barnett et al. ................. 315/3.5

FOREIGN PATENT DOCUMENTS

KR 1020060115718 A 11/2006
KR 1020100121941 A 11/2010
WO 2005/017938 A2 2/2005

OTHER PUBLICATIONS

J.A. Dayton, et al; "Submillimeter Backward Wave Oscillators", International Journal of Infrared and Millimeter Waves, Volo. 8, No. 10, Oct. 1987; pp. 1257-1268.
Mauro Mineo, et al; "Corrugated Rectangular Waveguide Tunable Backward Wave Oscillator for Terahertz Applications", IEEE Transactions on Electron Devices, vol. 57, No. 6, Jun. 2010; pp. 1481-1484.

* cited by examiner

*Primary Examiner* — Arnold Kinkead
(74) *Attorney, Agent, or Firm* — Ladas & Parry LLP

(57) ABSTRACT

Provided is a backward-wave oscillator in a communication system, including a waveguide formed of a metamaterial. A unit structure of the waveguide may include: a top plate; a short-circuited stub; a bottom plate separated at a predetermined gap from the top plate, and having the short-circuited stub formed in the center thereof; a first metal pillar connecting the top plate at a first port positioned on one surface based on the short-circuited stub to the bottom plate at a second port positioned on the opposite surface of the first port based on the short-circuited stub; and a second metal pillar separated from the first metal pillar, and connecting the top plate at the second port to the bottom plate at the first port.

5 Claims, 3 Drawing Sheets

BACKWARD-WAVE OSCILLATOR IN COMMUNICATION SYSTEM

CROSS-REFERENCE TO RELATED APPLICATIONS

The present application claims priority of Korean Patent Application No. 10-2013-0105975, filed on Sep. 4, 2013, which is incorporated herein by reference in its entirety.

BACKGROUND OF THE INVENTION

1. Field of the Invention

Exemplary embodiments of the present invention relate to a communication system; and, more particularly, to a backward-wave oscillator using a metamaterial waveguide.

2. Description of Related Art

In general, a backward-wave oscillator is a device which allows electronic beams to enter a beam tunnel so as to generate microwaves and terahertz electromagnetic waves. The backward-wave oscillator includes a waveguide. The phase velocity of an unloaded waveguide is higher than or almost equal to the light velocity, but the phase velocity of electronic beam is lower than the light velocity. Thus, it is difficult to combine electronic waves and electronic beams using the unloaded waveguide. Therefore, a periodic-structure waveguide of which the phase velocity is lower than the light velocity is used as the waveguide of the backward-wave oscillator. The backward-wave oscillator causes the electronic waves and electronic beams to interact in the periodic-structure waveguide.

The backward-wave oscillator using the periodic-structure waveguide acquires a point at which the phase velocity of the periodic-structure waveguide coincides with the phase velocity of electronic beams, which is lower than the light velocity, in a spatial harmonic region. The backward oscillator generates microwaves and terahertz electromagnetic waves through the interaction between the periodic-structure waveguide and the electronic beams at the frequency at which the two phase velocities coincide with each other.

The conventional backward-wave oscillator must use the slow wave dispersion characteristic of the periodic-structure waveguide due to the phase velocity of electronic beams, which is lower than the light velocity. Thus, the conventional backward-wave oscillator must use backward waves corresponding to the spatial harmonic region.

SUMMARY OF THE INVENTION

An embodiment of the present invention is directed to a backward-wave oscillator using a metamaterial waveguide for operation in a fundamental mode regardless of the limit of spatial harmonics.

Another embodiment of the present invention is directed to a backward-wave oscillator having a reduced size.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, there is provided abackward-wave oscillator in a communication system, including a waveguide formed of a metamaterial. A unit structure of the waveguide may include: a top plate; a short-circuited stub; a bottom plate separated at a predetermined gap from the top plate, and having the short-circuited stub formed in the center thereof; a first metal pillar connecting the top plate at a first port positioned on one surface based on the short-circuited stub to the bottom plate at a second port positioned on the opposite surface of the first port based on the short-circuited stub; and a second metal pillar separated from the first metal pillar, and connecting the top plate at the second port to the bottom plate at the first port.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

An embodiment of the present invention provides a backward-wave oscillator using a metamaterial waveguide in a communication system. The backward-wave oscillator in accordance with the embodiment of the present invention includes a waveguide having a backward-wave dispersion curve in a wideband.

Figure 1:
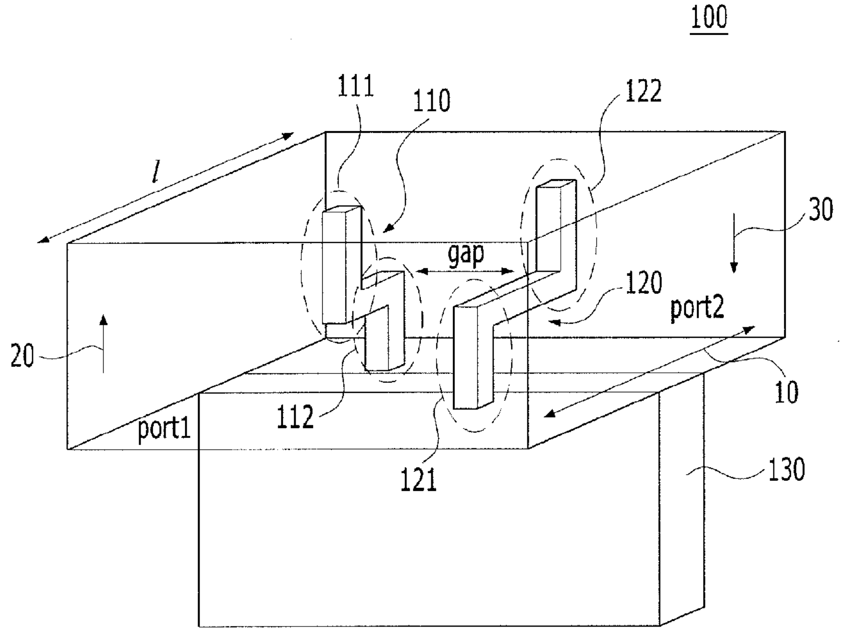
FIG. 1 schematically illustrates a unit structure of a metamaterial waveguide used in a backward-wave oscillator in accordance with an embodiment of the present invention.

FIG. 1 schematically illustrates a unit structure of a metamaterial waveguide used in a backward-wave oscillator in accordance with an embodiment of the present invention.

Referring to FIG. 1, the unit structure 100 of the metamaterial waveguide includes a first metal pillar 110, a second metal pillar 120, and a short-circuited stub 130. Based on the short-circuited stub 130, one surface forms a first port, and the opposite surface thereof forms a second port.

The first metal pillar 110 is separated at a predetermined gap from the second metal pillar 120, and set in parallel to a reference direction 10 between the first and second ports. The first metal pillar 110 is formed in a first direction 20 at the first port as indicated by reference numeral 111, and formed in a second direction 30 at the second port as indicated by reference numeral 112. For example, both ends of the first metal pillar 110 is bent at right angles, and formed in the opposite direction at the first and second ports.

The second metal pillar 120 is separated at the predetermined gap from the first metal pillar 110, and set in parallel to the reference direction 10 between the first and second ports.

The second metal pillar 120 is formed in the second direction 30 at the first port, and formed in the first direction 20 at the second port. For example, both ends of the second metal pillar 120 are bent at right angles, and formed in the opposite direction at the first and second ports.

The first and second metal pillars 110 and 120 are formed with a pillar directed to an E-plane so as to have negative effective permittivity. In order to form a transmission band according to the broadband left-hand rule in a, the first and second metal pillars 110 and 120 may be formed in a twisted shape.

The short-circuited stub 130 may be positioned under the metal pillars 110 and 120. The short-circuited stub 130 has negative effective magnetic permeability at a specific frequency.

FIG. 1 illustrates that the unit structure 100 of the metamaterial waveguide does not include top and bottom plates, for convenience of description. Thus, the unit structure of the metamaterial waveguide including the top and bottom plates will be described with reference to FIG. 2.

Figure 2:
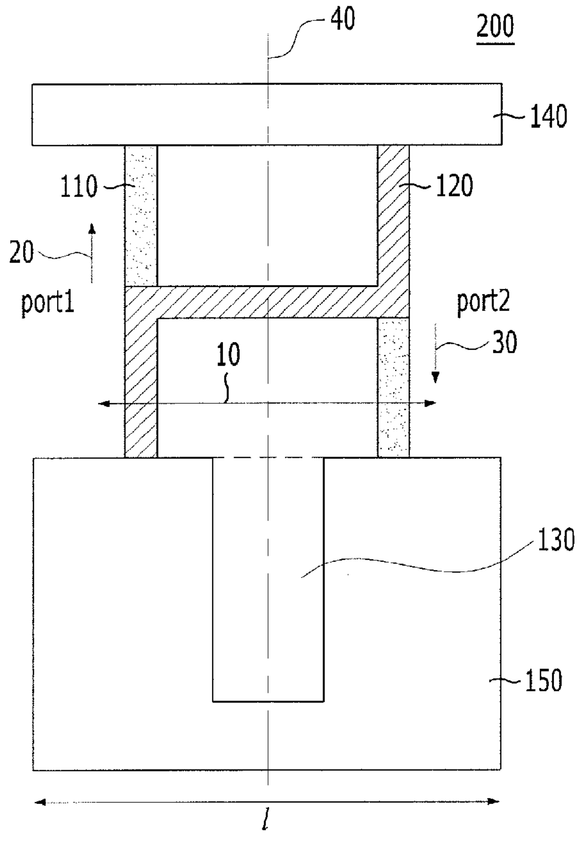
FIG. 2 schematically illustrates the unit structure of the metamaterial waveguide including top and bottom plates in the backward-wave oscillator in accordance with the embodiment of the present invention.

FIG. 2 schematically illustrates the unit structure of the metamaterial waveguide including top and bottom plates in the backward-wave oscillator in accordance with the embodiment of the present invention.

Referring to FIG. 2, the unit structure 200 of the metamaterial waveguide further includes a top plate 140 and a bottom plate 150, in addition to the unit structure 100 of the metamaterial waveguide illustrated in FIG. 1. FIG. 2 illustrates the unit structure 200 of the metamaterial waveguide, seen from a side.

The top plate 140 is positioned at the top of the metal pillars 110 and 120.

The bottom plate 150 is positioned at the bottom of the metal pillars 110 and 120. The bottom plate 150 includes the short-circuited stub 130 formed therein, based on the center line 40 of the short-circuited stub 130.

The top and bottom plates 140 and 150 form the length 1 of the unit structure between the first and second ports.

Based on the ends of the first and second metal pillars 110 and 120, the first direction 20 corresponds to the direction from the bottom plate 150 to the top plate 140, and the second direction 30 corresponds to the direction from the top plate 140 to the bottom plate 150.

Thus, the first metal pillar 110 connects the top plate at the first port to the bottom plate at the second port, based on the short-circuited stub 130. The second metal pillar 120 connects the top plate at the second port to the bottom plate at the first port, based on the short-circuit stub 130.

At this time, the metamaterial waveguide based on the metamaterial waveguide unit structure may have a cut-off frequency of 6.54 Ghz, for example.

Figure 3:
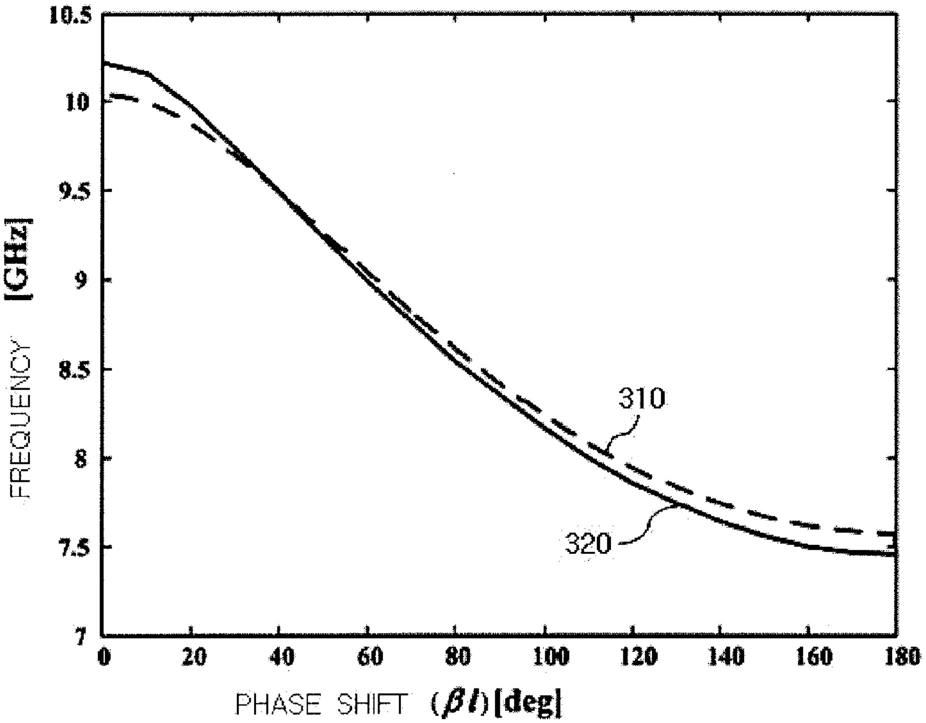
FIG. 3 is a graph schematically illustrating a dispersion curve of the metamaterial waveguide in accordance with the embodiment of the present invention.

FIG. 3 is a graph schematically illustrating a dispersion curve of the metamaterial waveguide in accordance with the embodiment of the present invention.

In FIG. 3, the horizontal axis of the graph indicates a phase shift βl, and the vertical axis of the graph indicates a frequency (GHz). Here, β represents a fundamental propagation constant of the metamaterial waveguide, and l represents the length of the unit structure.

The graph illustrates a simulation result for checking a transmission characteristic of the metamaterial waveguide. At this time, the dispersion curve based on the frequency of the metamaterial waveguide has a backward-wave transmission characteristic in a fundamental mode region. That is, the metamaterial waveguide forms a dispersion curve in the fundamental mode region instead of a spatial harmonic region.

In the graph of FIG. 3, a dotted line 310 indicates the operation simulation result in the ideal mode, and a solid line 320 indicates a simulation result using the proposed metamaterial waveguide.

At the cut-off frequency or more of the metamaterial waveguide, it is possible to check a wideband transmission characteristic corresponding to about 26.5% (7.53 GHz to 9.84 GHz) of a fractional bandwidth.

Figure 4:
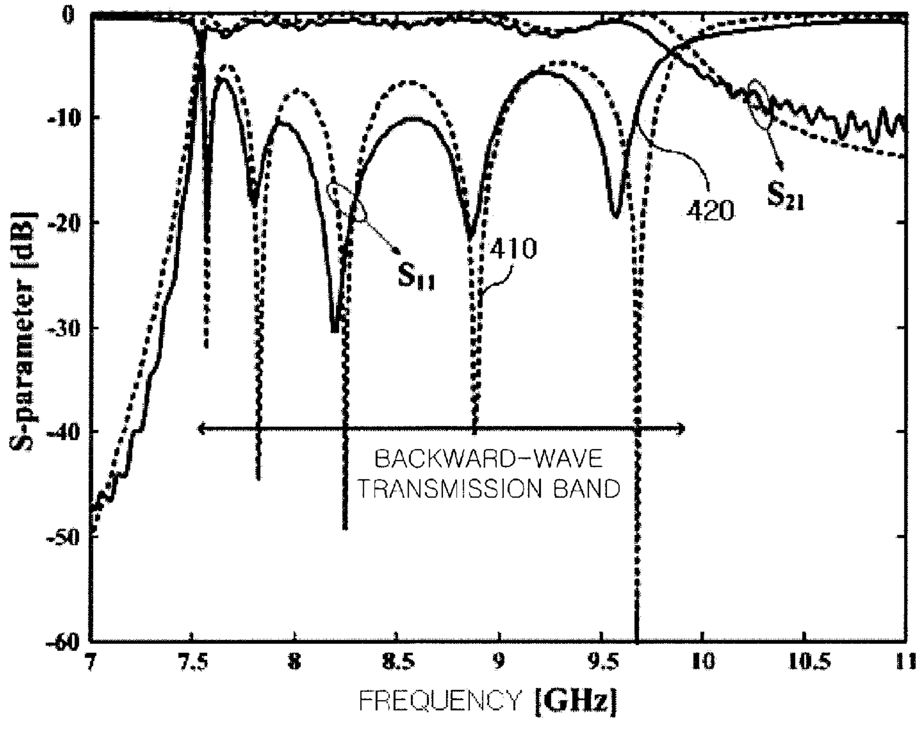
FIG. 4 is a graph schematically illustrating distributed transmission characteristics of the metamaterial waveguide in accordance with the embodiment of the present invention.

FIG. 4 is a graph schematically illustrating distributed transmission characteristics of the metamaterial waveguide in accordance with the embodiment of the present invention.

In FIG. 4, the horizontal axis of the graph indicates a frequency (GHz), and the vertical axis of the graph indicates an S-parameter (dB).

The metamaterial waveguide uses five metamaterial waveguide unit structures. Referring to FIG. 4, it can be seen that the transmission characteristic of the metamaterial waveguide coincides with the frequency band (backward-wave transmission band) of 7.53 GHz to 9.84 GHz, which has been checked with reference to FIG. 3.

In the graph of FIG. 4, a dotted line 410 indicates a virtual simulation result, and a solid line 420 indicates an actual simulation result obtained by using the proposed metamaterial waveguide.

The metamaterial waveguide exhibits an excellent transmission characteristic with an insertion loss of 2.3 dB in the entire transmission band. Thus, the metamaterial waveguide in accordance with the embodiment of the present invention exhibits a backward-wave characteristic in the fundamental mode region instead of the harmonic wave region. Furthermore, the metamaterial waveguide has a wider transmission band and a low insertion loss than existing waveguides.

Therefore, the metamaterial waveguide in accordance with the embodiment of the present invention has a condition suitable for being applied to the backward-wave oscillator.

Figure 5:
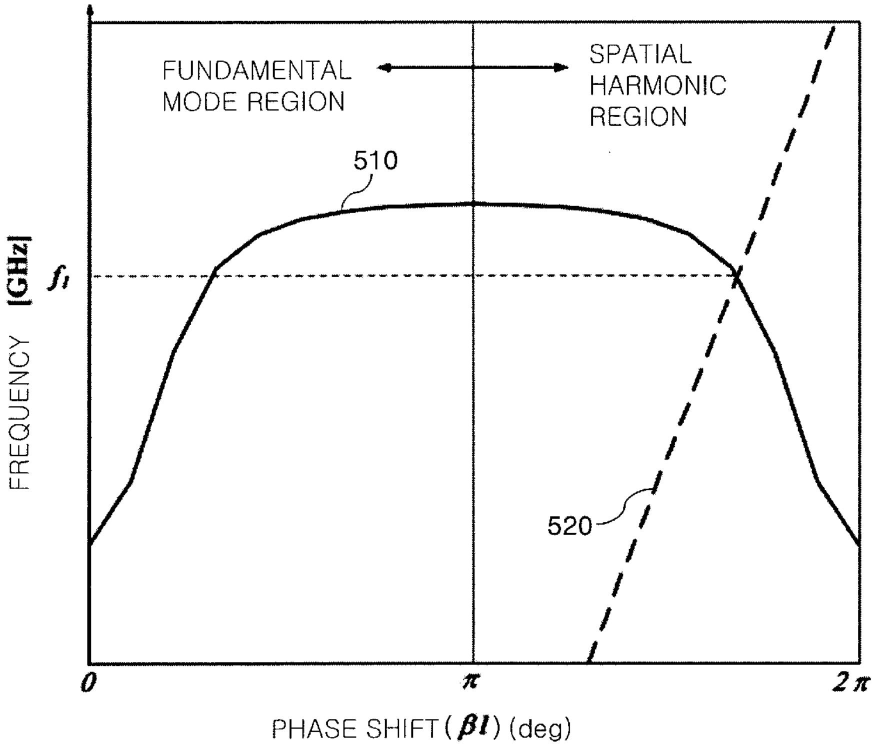
FIG. 5 (Prior Art)
FIG. 5 schematically illustrates the interaction between a conventional periodic-structure waveguide and electronic beams.

FIG. 5 schematically illustrates the interaction between a conventional periodic-structure waveguide and electronic beams.

In FIG. 5, the horizontal axis of the graph indicates a phase shift of 0 to 2π, and the vertical axis of the graph indicates a frequency (GHz).

In the horizontal axis, a phase shift of 0 to π corresponds to a fundamental mode region, and a phase shift of π to 2π corresponds to a spatial harmonic region. FIG. 4 illustrates the dispersion characteristic of electronic beams and a corrugated waveguide which is a representative example of the periodic-structure waveguide.

The periodic-structure waveguide has slow-wave characteristics. At this time, the propagation constant $\beta_n$ of the spatial harmonic region may be expressed as Equation 1 below.

$$\beta_n = \beta + \frac{2n\pi}{l} \quad \text{[Equation 1]}$$

Here, β represents a fundamental propagation constant of the periodic-structure waveguide, n represents an integer, and l represents the length of the unit structure of the periodic-structure waveguide. The fundamental propagation constant indicates when n is 0, and corresponds to the fundamental mode region. When n has a negative value, the fundamental propagation constant may have a negative value, and correspond to the spatial harmonic region. At this time, the periodic-structure waveguide exhibits a backward-wave characteristic in which the phase velocity is the opposite of the group velocity.

The periodic-structure waveguide interacts with electronic beams at a frequency $f_1$ of the point where the phase velocity 510 of the periodic-structure waveguide coincides with the phase velocity 520 of the electronic beams, in the spatial harmonic region. Then, the periodic-structure waveguide generates microwaves and terahertz electromagnetic waves.

Figure 6:
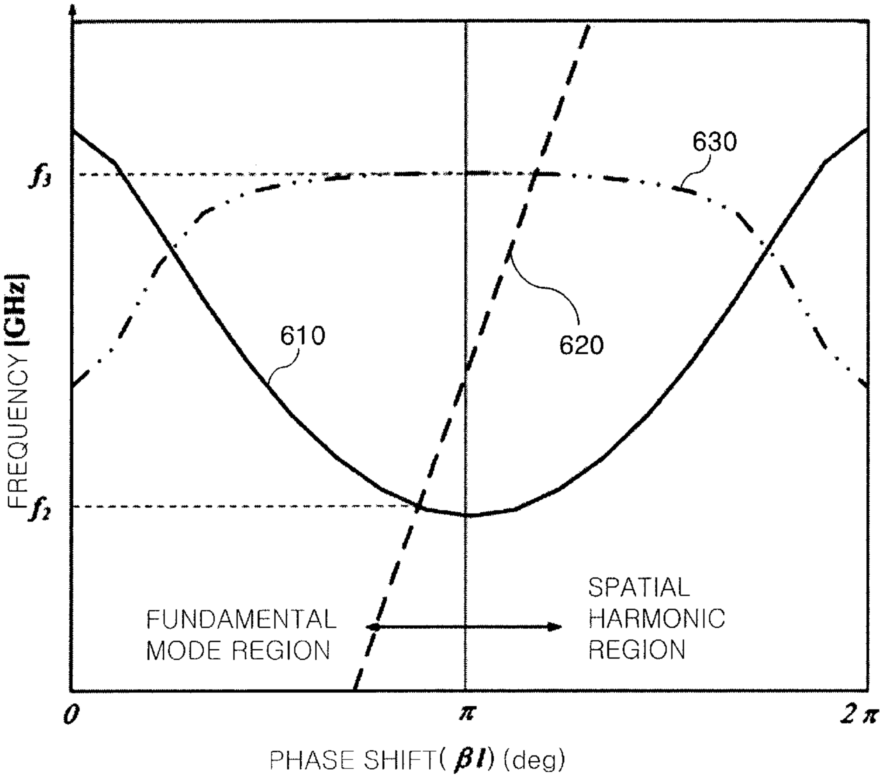
FIG. 6 schematically illustrates the interaction between electronic beams and the metamaterial waveguide in accordance with the embodiment of the present invention.

FIG. 6 schematically illustrates the interaction between electronic beams and the metamaterial waveguide in accordance with the embodiment of the present invention.

In FIG. 6, the horizontal axis of the graph indicates a phase shift of 0 to 2π, and the vertical axis of the graph indicates a frequency (GHz).

In the horizontal axis, a phase shift of 0 to π corresponds to a fundamental mode region, and a phase shift of π to 2π corresponds to a spatial harmonic region.

The phase velocity 610 of the metamaterial waveguide in accordance with the embodiment of the present invention and the phase velocity 630 of the periodic-structure waveguide are illustrated in different shapes.

Thus, the metamaterial waveguide interacts with the electronic beams at a frequency $f_2$ of the point where the phase velocity 610 of the metamaterial waveguide coincides with the phase velocity 620 of the electronic beams, and generates microwaves and terahertz electromagnetic waves.

At this time, the point where the phase velocity 610 of the metamaterial waveguide coincides with the phase velocity 620 of the electronic beams belongs to the fundamental mode region which is positioned in the left side based on a phase shift of π, that is, the region having a value of 0 to π.

On the other hand, the point where the phase velocity 630 of the conventional periodic-structure waveguide coincides with the phase velocity 620 of the electronic beams belongs to the spatial harmonic region which is positioned in the right side based on the phase shift of π. Thus, it is possible to check the frequency $f_2$ of the point where the phase velocity 630 of the conventional periodic-structure waveguide coincides with the phase velocity 620 of the electronic beams.

The metamaterial waveguide in accordance with the embodiment of the present invention may form the operation frequency of the backward-wave oscillator at the frequency $f_2$ lower than the conventional periodic-structure waveguide. Thus, the backward-wave oscillator using the metamaterial waveguide may be reduced in size, compared to the conventional periodic-structure waveguide. Furthermore, the backward-wave oscillator operating in the microwave band may have additional advantages based on the reduction in size.

In accordance with the embodiment of the present invention, a plurality of metamaterial waveguide unit structures may be connected to form the metamaterial waveguide. The metamaterial waveguide has a rectangular waveguide structure having a transmission characteristic based on the broadband left-hand rule. The metamaterial waveguide may have a dispersion characteristic based on the broadband left-hand rule, at the cut-off frequency of the metamaterial waveguide. The backward-wave oscillator generates microwaves and terahertz electromagnetic waves using the proposed metamaterial waveguide.

In accordance with the embodiment of the present invention, as the backward-wave oscillator uses the metamaterial waveguide, the backward-wave oscillator may operate in the fundamental mode regardless of the limit of spatial harmonics. Furthermore, as the backward-wave oscillator interacts with electronic beams at a lower frequency than the conventional backward-wave oscillator, the backward-wave oscillator may be reduced in size.

While the present invention has been described with respect to the specific embodiments, it will be apparent to those skilled in the art that various changes and modifications may be made without departing from the spirit and scope of the invention as defined in the following claims.

What is claimed is:

1. A backward-wave oscillator in a communication system, comprising a waveguide formed of a metamaterial, wherein a unit structure of the waveguide comprises:

a top plate;

a short-circuited stub;

a bottom plate separated at a predetermined gap from the top plate, and having the short-circuited stub formed in the center thereof;

a first metal pillar connecting the top plate at a first port positioned on one surface based on the short-circuited stub to the bottom plate at a second port positioned on the opposite surface of the first port based on the short-circuited stub; and a second metal pillar separated from the first metal pillar, and connecting the top plate at the second port to the bottom plate at the first port.

2. The backward-wave oscillator of claim 1, wherein the first and second metal pillars are implemented in a pillar shape directed to an E-plane.

3. The backward-wave oscillator of claim 2, wherein an end of the first metal pillar at the first port is formed in a first direction from the bottom plate to the top plate, and the other end of the first metal pillar at the second port is formed in a second direction from the top plate to the bottom plate.

4. The backward-wave oscillator of claim 3, wherein an end of the second metal pillar at the first port is formed in the second direction, and the other end of the second metal pillar at the second port is formed in the first direction.

5. The backward-wave oscillator of claim 1, wherein the waveguide generates microwave and terahertz-wave frequencies in a fundamental mode region where a phase shift formed by the fundamental propagation constant of the metamaterial waveguide and the length of the unit structure of the waveguide has a value of 0 to π.

* * * * *